(12) United States Patent
Chou

(10) Patent No.: US 7,847,629 B2
(45) Date of Patent: Dec. 7, 2010

(54) SAMPLE-AND-HOLD AMPLIFIERS

(75) Inventor: Yu-Kai Chou, Kaohsiung (TW)

(73) Assignee: Mediatek Inc., Hsinchu (TW)

( * ) Notice: Subject to any disclaimer, the term of this patent is extended or adjusted under 35 U.S.C. 154(b) by 53 days.

(21) Appl. No.: 12/357,506

(22) Filed: Jan. 22, 2009

(65) Prior Publication Data

US 2009/0195315 A1 Aug. 6, 2009

Related U.S. Application Data

(60) Provisional application No. 61/025,843, filed on Feb. 4, 2008.

(51) Int. Cl.
*H03F 1/02* (2006.01)
(52) U.S. Cl. .......................................... 330/9; 330/277
(58) Field of Classification Search ..................... 330/9, 330/51, 277
See application file for complete search history.

(56) References Cited

U.S. PATENT DOCUMENTS

| | | | | |
|---|---|---|---|---|
| 3,675,144 A | * | 7/1972 | Zuk | ........................... 330/277 |
| 4,594,560 A | * | 6/1986 | Dingwall et al. | ............ 330/296 |
| 4,713,676 A | * | 12/1987 | Thim | ........................... 326/102 |
| 5,990,744 A | * | 11/1999 | Nagaraj | ....................... 330/277 |
| 6,522,194 B1 | * | 2/2003 | Pehlke | ........................... 330/10 |
| 7,019,580 B1 | | 3/2006 | Michalski | |
| 2007/0103207 A1 | | 5/2007 | Huang | |

FOREIGN PATENT DOCUMENTS

GB 2 298 979 9/1996

* cited by examiner

*Primary Examiner*—Henry K Choe
(74) *Attorney, Agent, or Firm*—Thomas, Kayden, Horstemeyer & Risley

(57) ABSTRACT

A sample-and-hold amplifier is provided. The sample-and-hold amplifier comprises a sample-and-hold circuit and a buffer circuit. The sample-and-hold circuit receives an input signal and transmits the input signal to a first node according to a control signal. The buffer circuit is coupled between a supply voltage source and a ground and controlled by the first node to provide an output signal at an output node. The buffer circuit comprises a native MOS transistor coupled to the output node.

16 Claims, 4 Drawing Sheets

US 7,847,629 B2

SAMPLE-AND-HOLD AMPLIFIERS

CROSS REFERENCE TO RELATED APPLICATIONS

The present application claims the benefit of U.S. provisional application entitled "A HIGH SPEED AND LOW NOISE TRACK AND HOLD CIRCUIT", Ser. No. 61/025,843, filed Feb. 4, 2008.

BACKGROUND OF THE INVENTION

1. Field of the Invention

The invention relates to a sample-and-hold amplifier, and more particularly, to a sample-and-hold amplifier with a native MOS transistor.

2. Description of the Related Art

With decreased size and power consumption of integrated circuits, operation voltage of the integrated circuit has decreased. When level shifting, that is noise, occurs in a low voltage integrated circuit, the low voltage integrated circuit may output wrong signals. Especially, for a low voltage high resolution pipelined analog-digital converter (ADC) in digital applications, noise usually dominates overall signal-to-noise plus distortion ratio (SNDR) performance. The majority of the noise occurs in a sample-and-hold amplifier, which is usually the first stage of the pipelined ADC. Thus, it is important to reduce the noise of the sample-and-hold amplifier.

BRIEF SUMMARY OF THE INVENTION

An exemplary embodiment of a sample-and-hold amplifier comprises a sample-and-hold circuit and a buffer circuit. The sample-and-hold circuit receives an input signal and transmits the input signal to a first node according to a control signal. The buffer circuit is coupled between a supply voltage source and a ground and controlled by the first node to provide an output signal at an output node. The buffer circuit comprises a native MOS transistor coupled to the output node.

In some embodiments, a threshold voltage of the native MOS transistor for the aforementioned described embodiment is substantially closer to 0V or equal to 0V. A voltage provided by the supply voltage source is substantially in a range between about 1.0V to about 1.2V or substantially equal to 1.2V.

An exemplary embodiment of a sample-and-hold amplifier outputs an output signal at an output node and comprises a sample-and-hold circuit, a current source, and a native MOS transistor. The sample-and-hold circuit receives an input signal and transmits the input signal to a first node according to a control signal. The native MOS transistor is coupled to the current source at the output node and between a supply voltage source and a ground and controlled by the first node.

In some embodiments, a threshold voltage of the native MOS transistor of the aforementioned described embodiment is substantially closer to 0V or equal to 0V. A voltage provided by the supply voltage source is substantially in a range between about 1.0V to about 1.2V or substantially equal to 1.2V.

A detailed description is given in the following embodiments with reference to the accompanying drawings.

BRIEF DESCRIPTION OF THE DRAWINGS

The invention can be more fully understood by reading the subsequent detailed description and examples with references made to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

Figure 1:
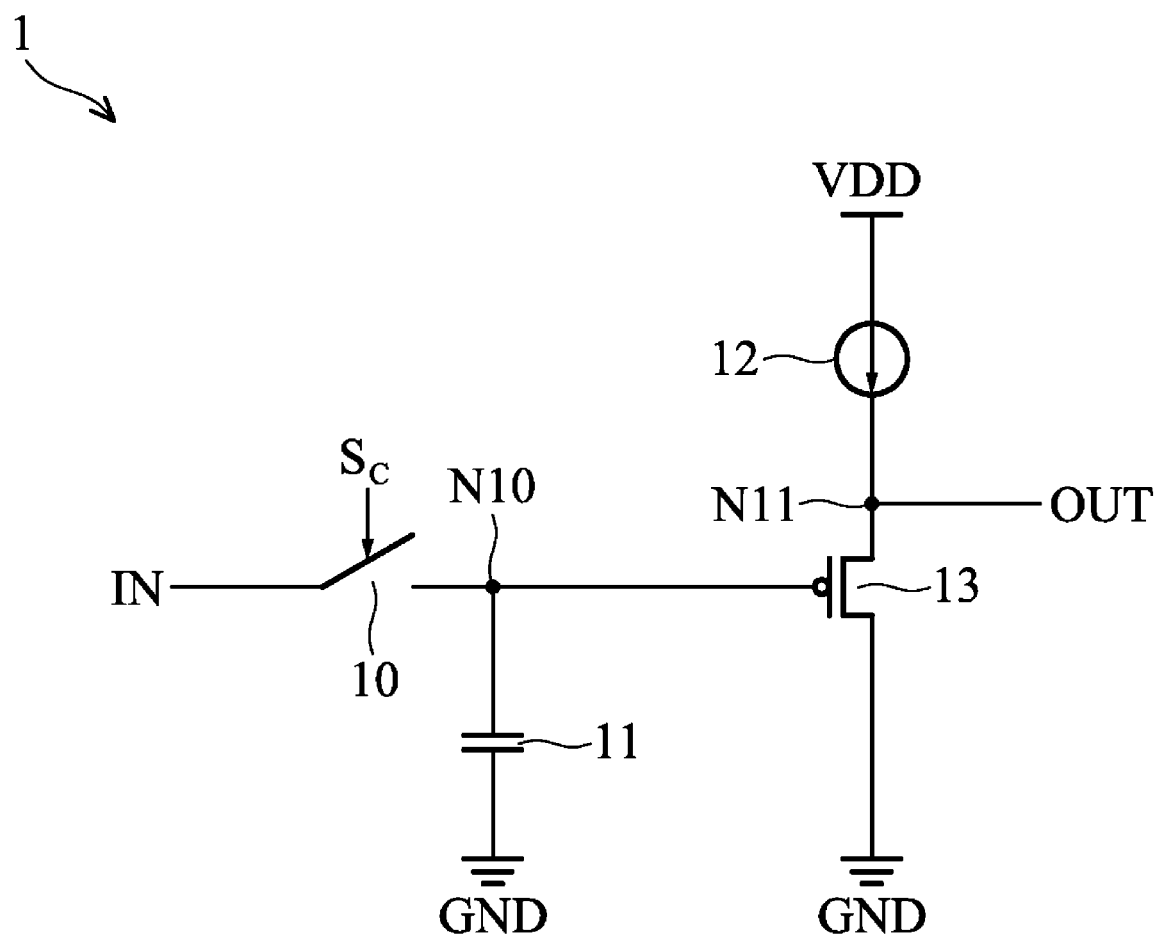
FIG. 1 shows a simple sample-and-hold amplifier.

FIG. 1 shows a simple sample-and-hold amplifier. Referring to FIG. 1, the sample-and-hold amplifier 1 comprises a switch device 10, a capacitor 11, a current source 12, and a PMOS transistor 13. The switch device 10 receives an input signal IN and is controlled by a control signal $S_C$ to be turned on or off. The capacitor 11 is coupled between a node N10 and a ground GND. The PMOS transistor 13 is coupled between an output node N11 and the ground GND and controlled by the node N10. The current source 12 is coupled between a supply voltage source VDD and the output node N11 which provides an output signal OUT.

It is assumed that the sample-and-hold amplifier 1 is applied in a low voltage application. The supply voltage source VDD provides a low voltage, which is about 1.2V, and the input signal IN is about 0.6V. The threshold voltage of the PMOS transistor 13 is about 0.3V. The current source 12 normally operates when the voltage difference between the supply voltage source VDD and the output node N11 is about 0.3V. When the switch device 10 is turned on according to the control signal $S_C$, the input signal IN is transmitted to the node N10. The voltage level of the node N10 is 0.6V, that is, the voltage level of the gate of the PMOS transistor 13 is 0.6V. The voltage level of the source of the PMOS transistor 13 is 0.9V from the threshold voltage. When the voltage level of the gate of the PMOS transistor 13 shifts by +0.25V, the voltage level of the source of the PMOS transistor 13 becomes 1.12V. Thus, the voltage level of the output signal OUT is 1.12V for following circuits of the low voltage application. Because the voltage level of the output signal OUT is close to 1.2V, the following circuits can not normally operate according to the output signal with the increased voltage level. Moreover, the voltage difference between the supply voltage source VDD and the output node N11 is decreased to 0.08V. Thus, the current source 12 can not work. For the low voltage application, the level shifting in the sample-and-hold amplifier 1 causes output distortion.

Figure 2:
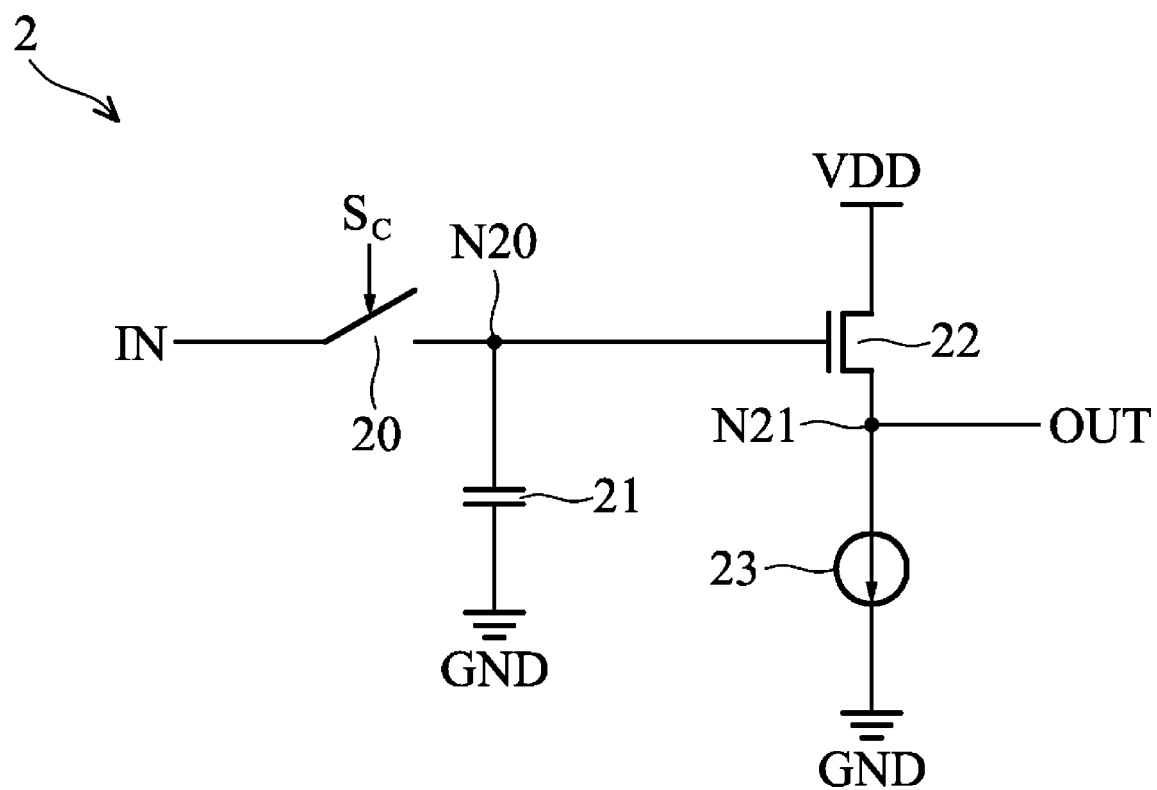
FIG. 2 shows another simple sample-and-hold amplifier.

FIG. 2 shows another simple sample-and-hold amplifier. Referring to FIG. 2, the sample-and-hold amplifier 2 comprises a switch device 20, a capacitor 21, a current source 22, and an NMOS transistor 23. It is assumed that the sample-and-hold amplifier 2 is applied in a low voltage application. The supply voltage source VDD provides a low voltage, which is about 1.2V, and an input signal IN is about 0.6V. The threshold voltage of the NMOS transistor 23 is about 0.3V.

The current source 22 normally operates when the voltage difference between the ground GND and an output node N21 is about 0.3V. When the switch device 20 is turned on according to a control signal $S_C$, the input signal IN is transmitted to the node N20. The voltage level of the node N20 is 0.6V, that is, the voltage level of the gate of the NMOS transistor 23 is 0.6V. The voltage level of source of the NMOS transistor 23 is 0.3V from the threshold voltage of the low voltage application. When the voltage level of the gate of the NMOS transistor 23 shifts by −0.25V, the voltage level of the source of the NMOS transistor 23 becomes 0.05V. Thus, the voltage level of the output signal OUT is 0.05V for following circuits. Because the voltage level of the output signal OUT is too low, the following circuits can not normally operate according to the output signal with the decreased voltage level. Moreover, the voltage difference between the ground voltage GND and the output node N21 is decreased to 0.05V. Thus, the current source 22 can not work. For the low voltage application, the level shifting in the sample-and-hold amplifier 2 causes output distortion.

Figure 3:
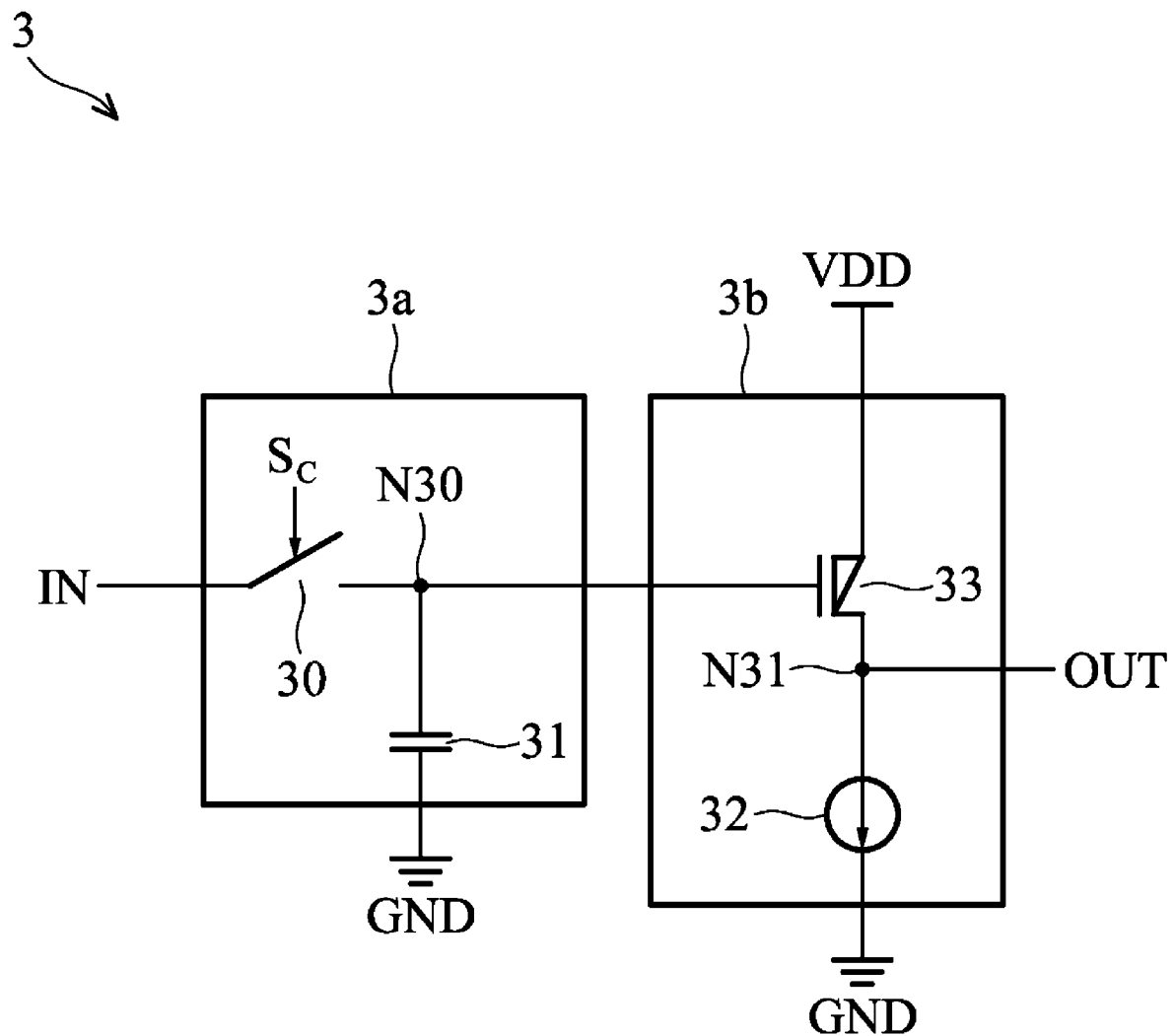
FIG. 3 shows an exemplary embodiment of a sample-and-hold amplifier.

FIG. 3 shows an exemplary embodiment of a sample-and-hold amplifier. Referring to FIG. 3, the sample-and-hold amplifier 3 comprises a sample-and-hold circuit 3a and a buffer circuit 3b. In the embodiment, the sample-and-hold circuit 3a comprises a switch device 30 and a capacitor 31, and the buffer circuit 3b comprises a current source 32 and a native NMOS transistor 33. The switch device 30 receives an input signal IN and is controlled by a control signal $S_c$ to be turned on or off. The capacitor 31 is coupled between a node N30 and a ground GND. A gate of the native NMOS transistor 33 is coupled to the node N30, a drain thereof is coupled to a supply voltage source VDD, and a source thereof is coupled to an output node N31 which provides an output signal OUT. The current source 32 is coupled between the output node N31 and the ground GND. In a low voltage application, the voltage provided by the supply voltage source VDD is substantially in a range between about 1.0V to about 1.2V or equal to about 1.2V.

As known in the art, the transistor "threshold voltage" is generally defined as the gate voltage required to "turn on" a transistor, and may be a positive or negative voltage depending on whether the transistor is an N-channel or P-channel device configured in native, depletion or enhancement mode. For example, the threshold voltage of an N-channel MOS (NMOS) transistor is generally positive for enhancement-mode and negative for depletion-mode. The opposite is true for PMOS devices. Thus, a MOS transistor is said to be "native" if no surface enhancement, depletion or threshold adjustment implantation steps are performed during fabrication of the MOS transistor. In other words, the channel region of a native transistor is formed directly on the surface of the well without performing an ion implantation or diffusion after well formation. The threshold voltage of a native or unimplanted NMOS transistor is substantially close to 0V or substantially equal to 0V. On the other hand, the threshold voltage of a native or unimplanted PMOS transistor is typically in the range between about −1.6V to about −1.8V. To bring the threshold voltage closer to 0V, one or more ion implantation steps may be performed after well formation to raise the threshold voltage of the PMOS transistor. In some cases, one or more threshold adjustment implantation steps may be performed to raise the threshold voltage of the PMOS device to within a range of about −0.4V to about +0.4V. In a preferred case, the threshold voltage of the ion implanted PMOS transistor may be substantially close to 0V or may be substantially equal to 0V.

According to the aforementioned description, the threshold voltage of the native NMOS transistor 33 is substantially close to 0V or substantially equal to 0V. The level shifting effect at the node N30 is degraded or can be neglected. When the sample-and-hold amplifier 3 is applied in a low voltage application and the level shifting effect occurs at the node N30, the voltage level of the output signal OUT can be in an appropriate range for the following circuits such that the following circuits can normally operate.

Figure 4:
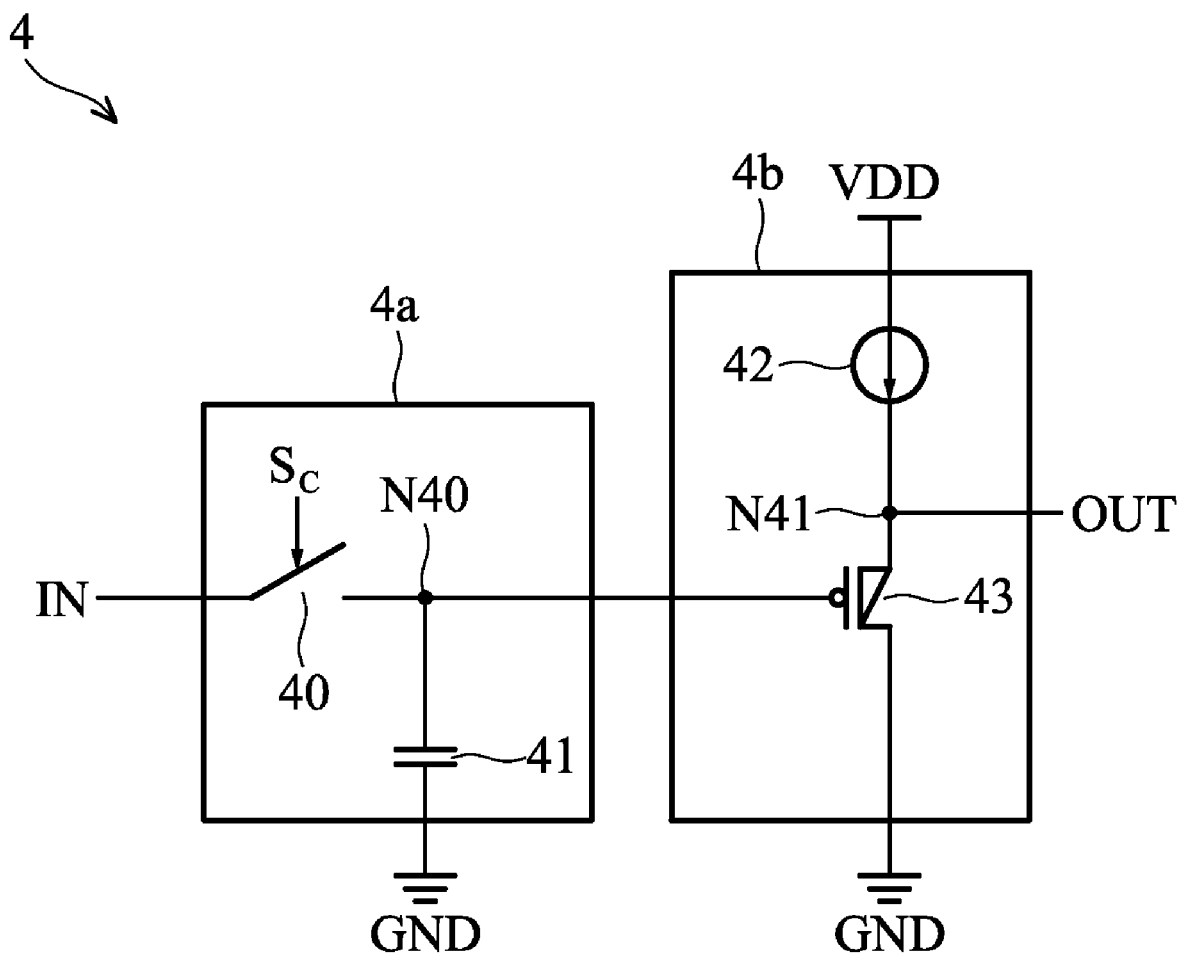
FIG. 4 shows another exemplary embodiment of a sample-and-hold amplifier.

FIG. 4 shows an exemplary embodiment of a sample-and-hold amplifier. Referring to FIG. 4, the sample-and-hold amplifier 4 comprises a sample-and-hold circuit 4a and a buffer circuit 4b. In the embodiment, the sample-and-hold circuit 4a comprises a switch device 40 and a capacitor 41, and the buffer circuit 4b comprises a current source 42 and a native PMOS transistor 43. The switch device 40 receives an input signal IN and is controlled by a control signal $S_c$ to be turned on or off. The capacitor 41 is coupled between a node N40 and a ground GND. A gate of the native PMOS transistor 43 is coupled to the node N40, a drain thereof is coupled to a ground voltage GND, and a source thereof is coupled to an output node N41 which provides an output signal OUT. The current source 42 is coupled between the output node N41 and a supply voltage source VDD. In a low voltage application, the voltage provided by the supply voltage source VDD is substantially in a range between about 1.0V to about 1.2V or equal to about 1.2V. Similarly, the threshold voltage of the native PMOS transistor 43 is substantially close to 0V or substantially equal to 0V. The level shifting effect at the node N40 is degraded or can be neglected. When the sample-and-hold amplifier 4 is applied in a low voltage application and the level shifting effect occurs at the node N40, the voltage level of the output signal OUT can be in an appropriate range for the following circuits such that the following circuits can normally operate.

In the above embodiments, the sample-and-hold circuits 3a and 4a of FIGS. 3 and 4 are given as an example. For application, the circuitry of a sample-and-hold circuit is determined according to requirements.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A sample-and-hold amplifier comprising:
   a sample-and-hold circuit for receiving an input signal and transmitting the input signal to a first node according to a control signal; and
   a buffer circuit coupled between an supply voltage source and a ground and controlled by the first node to provide an output signal at an output node;
   wherein the buffer circuit comprises a native MOS transistor coupled to the output node, the buffer circuit further comprises a current source coupled to the native MOS transistor at the output node and between the supply voltage source and the ground; and
   wherein the native MOS transistor is N-type, a gate of the native MOS transistor is coupled to the first node, a drain thereof is coupled to the supply voltage source, and a source thereof is coupled to the current source at the output node.

2. The sample-and-hold amplifier as claimed in claim 1, wherein a threshold voltage of the native MOS transistor is substantially closer to 0V or equal to 0V.

3. The sample-and-hold amplifier as claimed in claim 1, wherein a voltage provided by the supply voltage source is substantially in a range between about 1.0V to about 1.2V.

4. The sample-and-hold amplifier as claimed in claim 1, wherein a voltage provided by the supply voltage source is substantially equal to 1.2V.

5. A sample-and-hold amplifier comprising:
a sample-and-hold circuit for receiving an input signal and transmitting the input signal to a first node according to a control signal; and
a buffer circuit coupled between an supply voltage source and a ground and controlled by the first node to provide an output signal at an output node;
wherein the buffer circuit comprises a native MOS transistor coupled to the output node, the buffer circuit further comprises a current source coupled to the native MOS transistor at the output node and between the supply voltage source and the ground; and
wherein the native MOS transistor is P-type, a gate of the native MOS transistor is coupled to the first node, a drain thereof is coupled to the ground, and a source thereof is coupled to the current source at the output node.

6. The sample-and-hold amplifier as claimed in claim 5, wherein a threshold voltage of the native MOS transistor is substantially closer to 0V or equal to 0V.

7. The sample-and-hold amplifier as claimed in claim 5, wherein a voltage provided by the supply voltage source is substantially in a range between about 1.0V to about 1.2V.

8. The sample-and-hold amplifier as claimed in claim 5, wherein a voltage provided by the supply voltage source is substantially equal to 1.2V.

9. A sample-and-hold amplifier, for outputting an output signal at an output node, the sample-and-hold amplifier comprising:
a sample-and-hold circuit for receiving an input signal and transmitting the input signal to a first node according to a control signal;
a current source; and
a native MOS transistor coupled to the current source at the output node and between a supply voltage source and a ground and controlled by the first node;
wherein the native MOS transistor is N-type, a gate of the native MOS transistor is coupled to the first node, a drain thereof is coupled to the supply voltage source, and a source thereof is coupled to the current source at the output node.

10. The sample-and-hold amplifier as claimed in claim 9, wherein a threshold voltage of the native MOS transistor is substantially closer to 0V or equal to 0V.

11. The sample-and-hold amplifier as claimed in claim 9, wherein a voltage provided by the supply voltage source is substantially in a range between about 1.0V to about 1.2V.

12. The sample-and-hold amplifier as claimed in claim 9, wherein a voltage provided by the supply voltage source is substantially equal to 1.2V.

13. A sample-and-hold amplifier, for outputting an output signal at an output node, the sample-and-hold amplifier comprising:
a sample-and-hold circuit for receiving an input signal and transmitting the input signal to a first node according to a control signal;
a current source; and
a native MOS transistor coupled to the current source at the output node and between a supply voltage source and a ground and controlled by the first node;
wherein the native MOS transistor is P-type, a gate of the native MOS transistor is coupled to the first node, a drain thereof is coupled to the ground, and a source thereof is coupled to the current source at the output node.

14. The sample-and-hold amplifier as claimed in claim 13, wherein a threshold voltage of the native MOS transistor is substantially closer to 0V or equal to 0V.

15. The sample-and-hold amplifier as claimed in claim 13, wherein a voltage provided by the supply voltage source is substantially in a range between about 1.0V to about 1.2V.

16. The sample-and-hold amplifier as claimed in claim 13, wherein a voltage provided by the supply voltage source is substantially equal to 1.2V.

* * * * *